United States Patent
Gatineau et al.

(10) Patent No.: US 8,546,276 B2
(45) Date of Patent: Oct. 1, 2013

(54) DEPOSITION OF GROUP IV METAL-CONTAINING FILMS AT HIGH TEMPERATURE

(75) Inventors: Julien Gatineau, Tsuchiura (JP); Changhee Ko, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 7 days.

(21) Appl. No.: 13/384,152

(22) PCT Filed: Jul. 14, 2010

(86) PCT No.: PCT/IB2010/053219
§ 371 (c)(1),
(2), (4) Date: Mar. 23, 2012

(87) PCT Pub. No.: WO2011/007323
PCT Pub. Date: Jan. 20, 2011

(65) Prior Publication Data
US 2012/0175751 A1    Jul. 12, 2012

Related U.S. Application Data

(60) Provisional application No. 61/225,280, filed on Jul. 14, 2009.

(51) Int. Cl.
*H01L 23/29*    (2006.01)
(52) U.S. Cl.
USPC ........... 438/785; 438/778; 438/786; 438/792; 427/250; 427/583

(58) Field of Classification Search
USPC ................. 438/584, 763, 680–681, 785–786, 438/778; 257/250, 583–585, 255.391, 255.392
See application file for complete search history.

(56) References Cited

U.S. PATENT DOCUMENTS

| 5,378,501 A | 1/1995 | Foster et al. |
| 6,949,827 B2 | 9/2005 | Sandhu et al. |

(Continued)

FOREIGN PATENT DOCUMENTS

| KR | 2007 0121281 | 12/2007 |
| KR | 10 0804413 | 2/2008 |

(Continued)

OTHER PUBLICATIONS

Carmalt, C.J. et al., "Synthesis of TiN thin films from titanium imido complexes," Journal of Material Chemistry, 2003, 13, pp. 84-87.

(Continued)

*Primary Examiner* — Dung A. Le
(74) *Attorney, Agent, or Firm* — Patricia E. McQueeney

(57) ABSTRACT

Disclosed are group IV metal-containing precursors and their use in the deposition of group IV metal-containing films {nitride, oxide and metal} at high process temperature. The use of cyclopentadienyl and imido ligands linked to the metal center secures thermal stability, allowing a large deposition temperature window, and low impurity contamination. The group IV metal (titanium, zirconium, hafnium)-containing film depositions may be carried out by thermal and/or plasma-enhanced CVD, ALD, and pulse CVD.

14 Claims, 5 Drawing Sheets

Comparison of thermal decomposition temperature of disclosed compounds with standard Ti molecules

(56) References Cited

U.S. PATENT DOCUMENTS

| | | | |
|---|---|---|---|
| 6,984,591 B1 | 1/2006 | Buchanan et al. | |
| 6,984,595 B1 * | 1/2006 | Yamazaki | 438/792 |
| 2008/0102205 A1 | 5/2008 | Barry et al. | |
| 2008/0254232 A1 | 10/2008 | Gordon et al. | |
| 2009/0036697 A1 | 2/2009 | Tada et al. | |

FOREIGN PATENT DOCUMENTS

| | | |
|---|---|---|
| WO | WO 91 08322 | 6/1991 |
| WO | WO 2005 123790 | 12/2005 |
| WO | WO 2008 013659 | 1/2008 |
| WO | WO 2008 148499 | 12/2008 |
| WO | WO 2009 012341 | 1/2009 |

OTHER PUBLICATIONS

Carmalt, C.J. et al., "Titanium imido complexes as precursors to titanium nitride," Journal of the Chemical Society, Dalton Trans., 2002, pp. 4055-4059.

Dunn, S.C. et al., Cyclopentadienyl, indenyl and bis(cyclopentadienyl) titanium imido compounds, Journal of the Chemical Society, Dalton Trans., 1997, pp. 293-304.

Franceschini, P.L. et al., "Volatile β-diketiminato- and β-diketiminato-based zirconium complexes as potential MOCVD precursors," Inorganic Chemistry, vol. 42, No. 22, Nov. 1, 2003, pp. 7273-7282.

Guiducci, A.E. et al., "Reactions of cyclopentadienyl-amidinate titanium imido compounds with $CS_2$, COS, isocyanates, and other unsaturated organic compounds," Organometallics, 2006, 25, pp. 1167-1187.

Hazari, N. et al., "Reactions and applications of titanium imido complexes," Accounts of Chemical Research, vol. 38, No. 11, Oct. 12, 2005, pp. 839-849.

Potts, S.E. et al., "Tungsten imido complexes as precursors to tungsten carbonitride thin films," The Royal Society of Chemistry, Dalton Trans., 2008, pp. 5730-5736.

Stewart, P.J. et al., "New binuclear alkyl and half-sandwich cyclopentadienyl imido titanium complexes containing acetamidinate and benzamidinate supporting ligands," Journal of Organometallic Chemistry, vol. 564, No. 1-2, Aug. 14, 1998, pp. 209-214.

Stewart, P.J. et al., "New titanium complexes containing an amidinate-imide supporting ligand set: Cyclopentadienyl, alkyl, borohydride, aryloxide, and amide derivatives," Organometallics 1998, 17, pp. 3271-3281.

International Search Report and Written Opinion for PCT/IB2010/053219, Nov. 10, 2010.

* cited by examiner

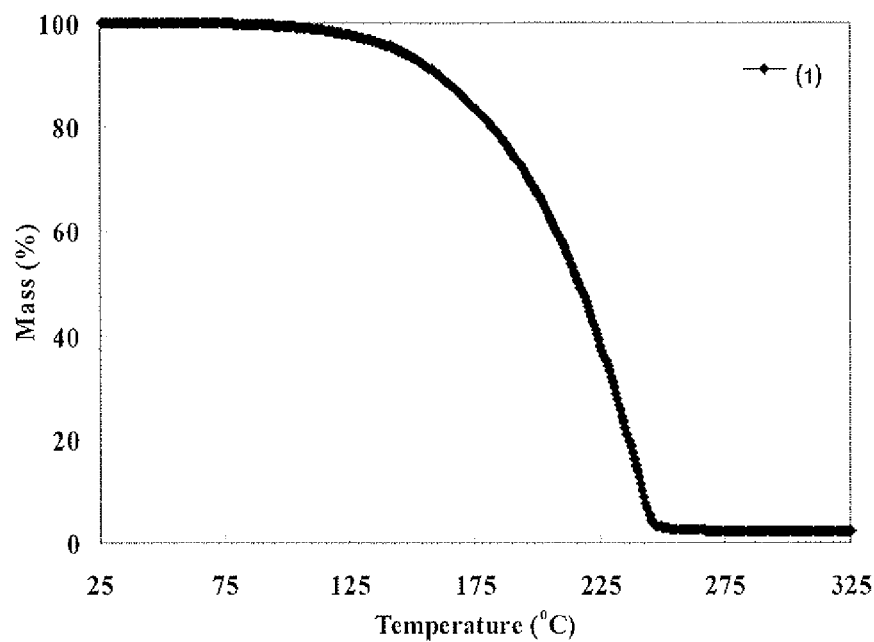
FIG 1 TGA of Compound 1, TiCp(NtBu)[MeC(N(SiMe$_3$))$_2$]
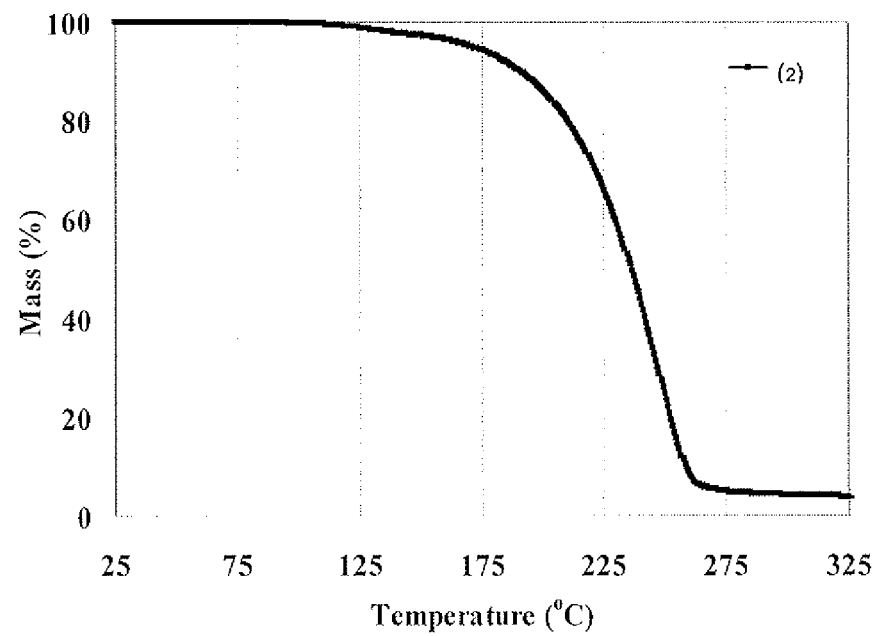
FIG 2 TGA of Compound 2, TiCp(NtBu)[MeC(NiPr)$_2$]

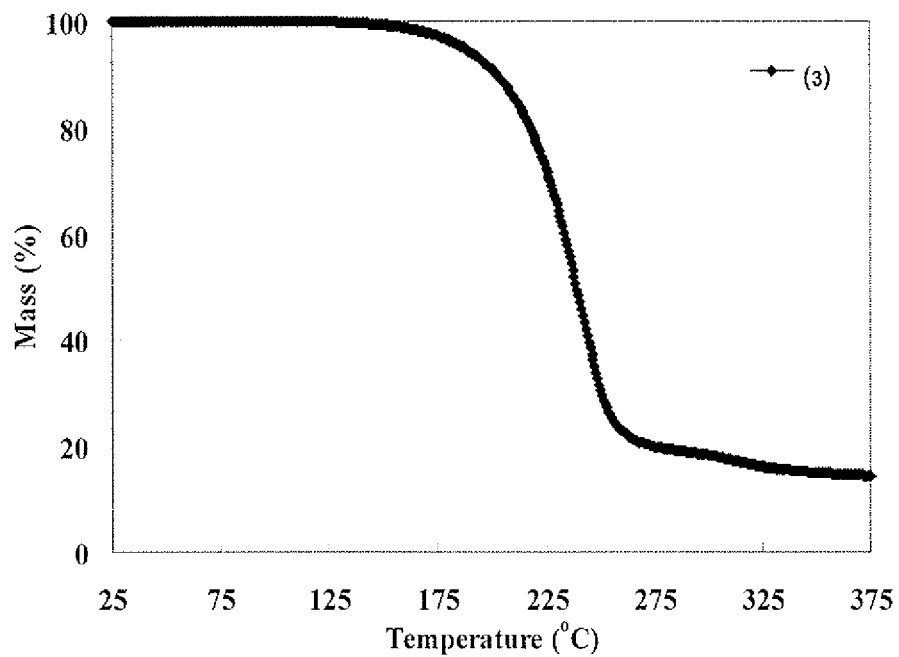
FIG 3 TGA of Compound 3, TiCp(NtBu)[MeC(NtBu)$_2$]
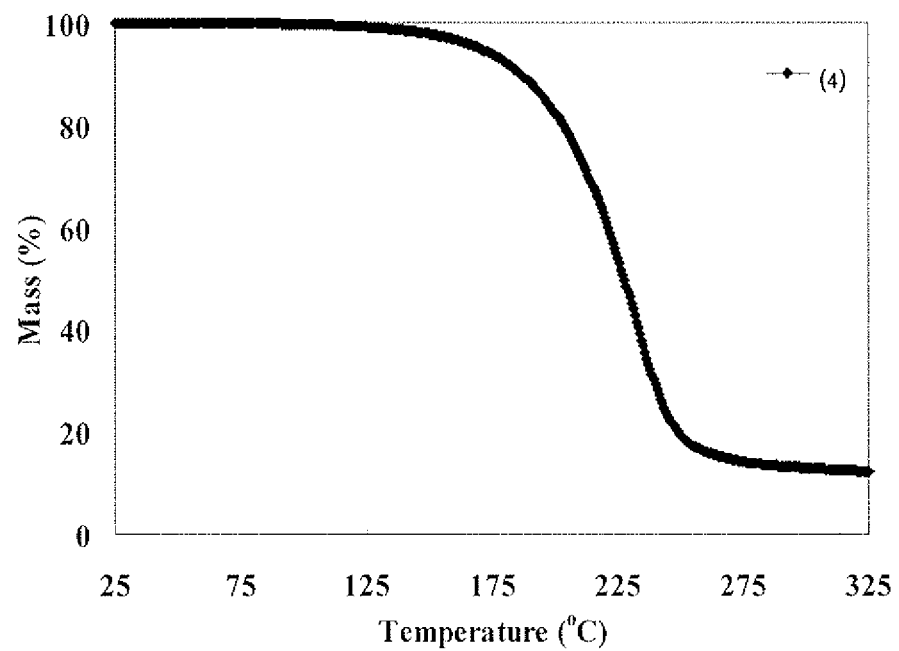
FIG 4 TGA of Compound 4, TiCp(NtBu)[MeC(NtBu/Et)$_2$]

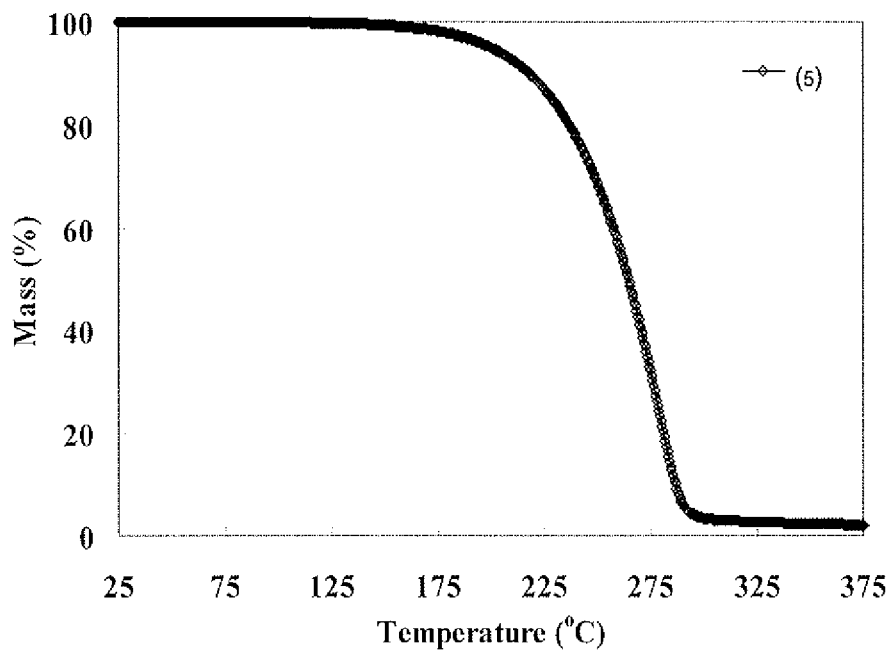
FIG 5 TGA of Compound 5, TiCp(NtBu)[HC(C(Me)N(Me))$_2$]
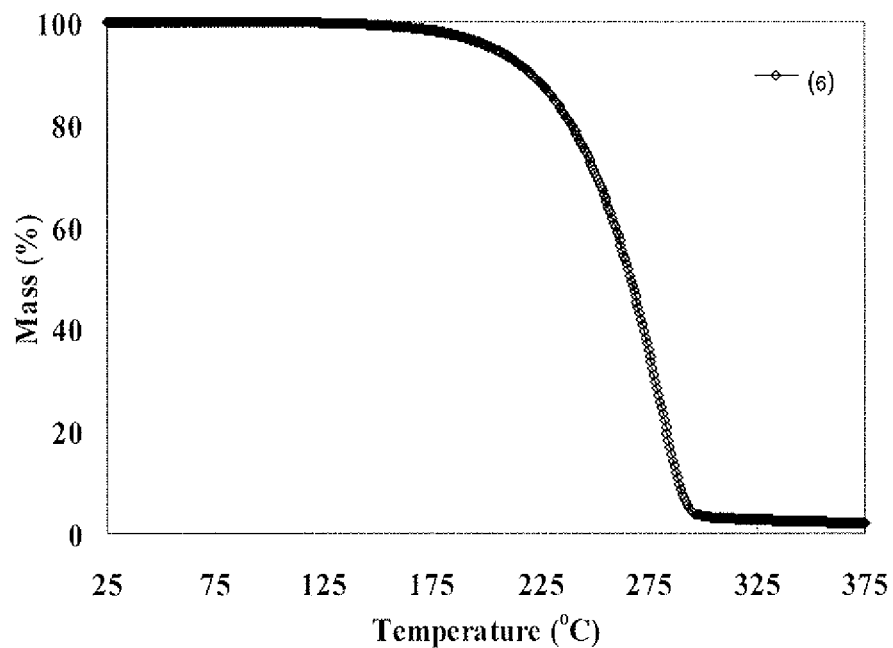
FIG 6 TGA of Compound 6, TiCp(NtBu)[HC(C(Me)N(Et))$_2$]

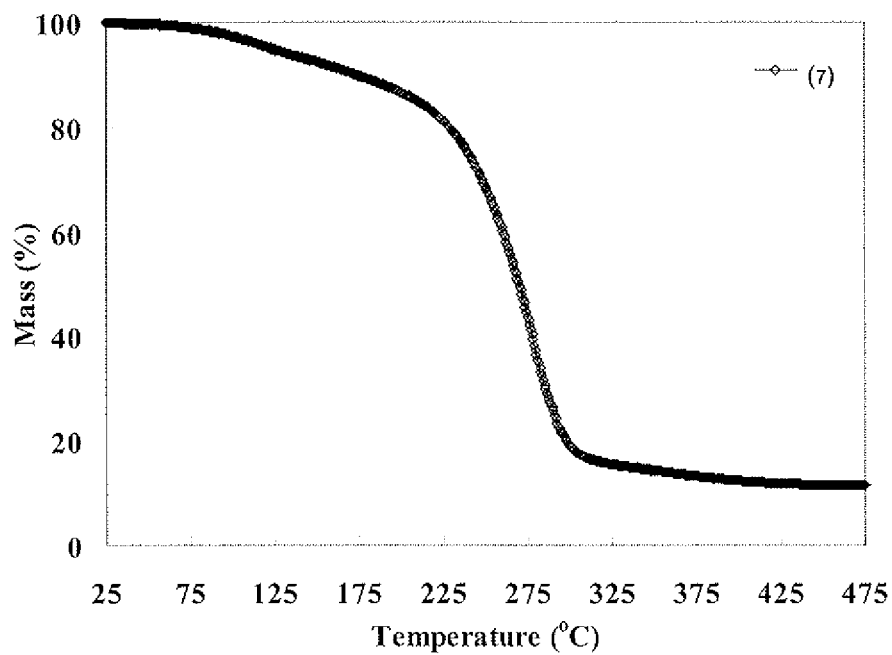
FIG 7 TGA of Compound 7, Ti(NtBu)[HC(C(Me)N(Me))$_2$]$_2$
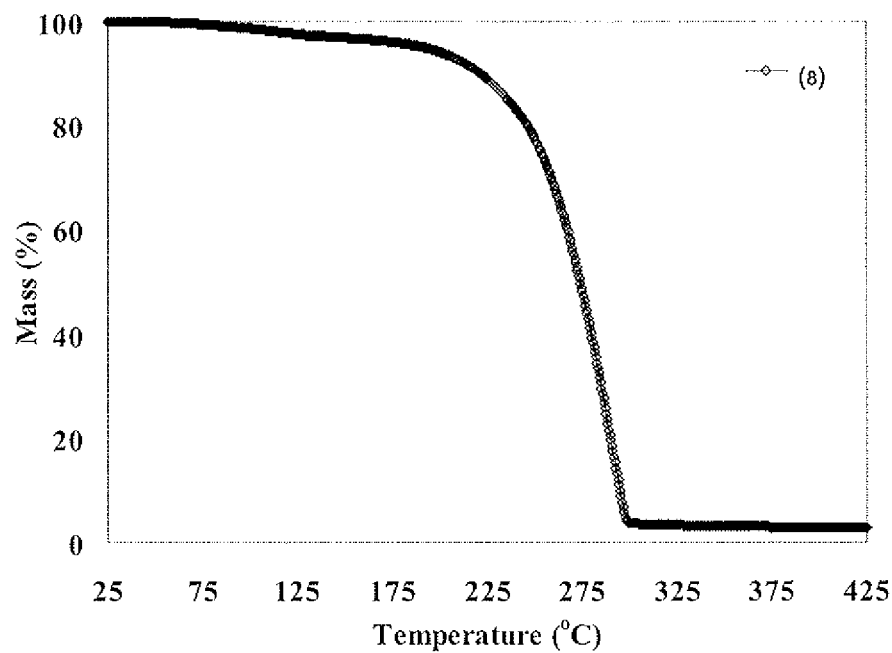
FIG 8 TGA of Compound 8, Ti(NtBu)[HC(C(Me)N(Et))$_2$]$_2$

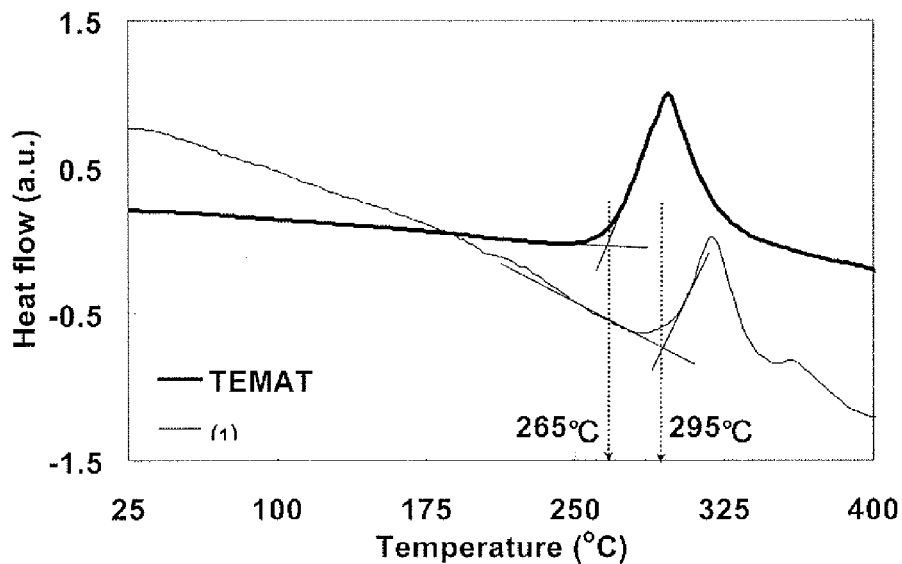
FIG 9 DSC of Compound 1, TiCp(NtBu)[MeC(N(SiMe$_3$))$_2$], and TEMAT (Ti(NEt/Me)$_4$)
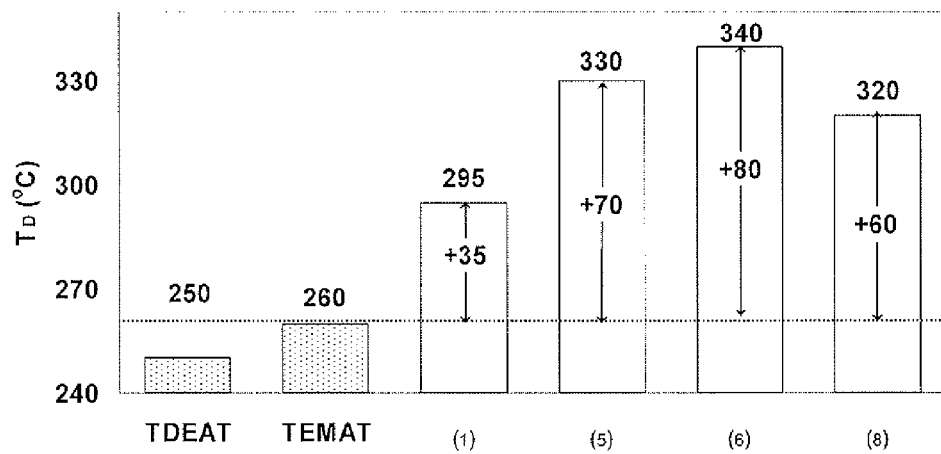
FIG 10 Comparison of thermal decomposition temperature of disclosed compounds with standard Ti molecules

DEPOSITION OF GROUP IV METAL-CONTAINING FILMS AT HIGH TEMPERATURE

CROSS REFERENCE TO RELATED APPLICATIONS

This application is a 371 of International PCT Application PCT/IB2010/053219, filed Jul. 14, 2010, which claims priority to U.S. provisional application No. 61/225,280, filed Jul. 14, 2009, the entire contents of each being incorporated herein by reference.

BACKGROUND

Chemical vapor deposition (CVD) and atomic layer deposition (ALD) have been adopted as the main deposition technique for depositing thin films to comply with the scaling down of semiconductor devices because CVD and ALD enables achievement of films (metal, oxide, nitride . . . etc) of finely defined thickness and high surface/step coverage. The film growth results from the chemical reaction of organometallic compounds (precursors), so it is essential to develop optimum precursors and understand its reaction process.

Precursors have been developed to attain required properties based on its application to certain types of desired film. However several basic properties should be considered to achieve good quality films. First, sufficient vapor pressure is necessary for easy delivery into the reaction chamber from containing vessel. Second, excellent thermal stability is required during the storage in the vessel at the storage temperature before delivery. Third, strong reactivity toward reacting gas is required to be readily converted into desired film in the deposition chamber. Another important requirement is controlling impurities in the film, which is usually originated from the ligand during the deposition process, has to be considered at the stage of precursor design.

Some group IV metal precursors have already been developed and used to deposit oxide or nitride metal films. The main titanium precursor is tetrachloro titanium, $TiCl_4$. It is widely used to make titanium-containing films. The use of molecules such as tetrakis(dimethylamino) titanium (TDMAT) and tetrakis (diethylamino) titanium (TDEAT) for titanium oxide in ALD mode with $H_2O$ have already been reported. See, e.g., EP0503001. Some nitride films were also deposited using ammonia as a co-reactant.

In the case of zirconium, tetrakis(dimethylamino) zirconium (TDMAZ) is now a standard material used to deposit zirconium-containing films, especially zirconium oxide. The low decomposition temperature of the molecule remains a problem in many processes.

Besides the above mentioned precursors, new molecules have also been developed.

Patent application publications (see, e.g., US 2008/0102205 and KR 2007/0121281) mention the use of cyclopentadienyl containing compounds, such as those shown below, as CVD/ALD precursors.

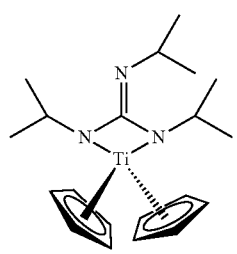

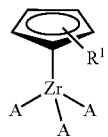

Biscyclopentadienyl triisopropyl-guanidinato titanium(III)
wherein $A=NR^2R^3$ or $ER^4$,
$E=O$ or $S$, $R^1=H$, Me, or Et,
$R^2$ & $R^3=C_1-C_4$ alkyl w/opt
F group or $SiR^5{}_3$, $R^4=C_1-C_6$ alkyl w/opt F group or $SiR^5{}_3$ & $R^5=C_1-C_4$ alkyl.

Molecules having two or three alkylamino ligands, together with ethylenediamino ligand, aminoalkylamino ligand, and guamidinato ligand have been mentioned as CVD/ALD precursors of Group IV metal nitride, metal oxide, and metal electrode applications (see, e.g., US Pat App Pub No 2009/0036697 and WO 2009/012341).

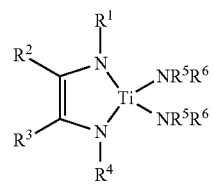

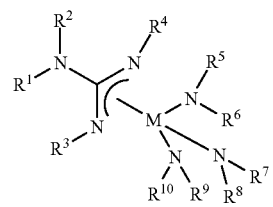

wherein $R^1$, $R^4=C_1-C_6$ alkyl,
$R^2$, $R^3=H$ or $C_1-C_3$ alkyl, & $R^5$,
$R^6=C_1-C_4$ alkyl
wherein $R^1-R^{10}=H$, $C_1-C_{12}$
alkyl, $C_1-C_{12}$ alkylamino, $C_1-C_{12}$ alkoxy, cycloalkyl, $C_2-C_{12}$
alkenyl, $C_7-C_{12}$ aralkyl, $C_7-C_{12}$
alkylaryl, $C_6-C_{12}$ aryl, $C_5-C_{12}$
heteroaryl, perfluoroalkyl,
& Si-containing groups Some patent application publications mentioning the use of imido type compounds with a Group IV or V metal, shown below, as catalysts for polymerization are also available (see, e.g., WO 2005/123790 and WO 2008/148499).

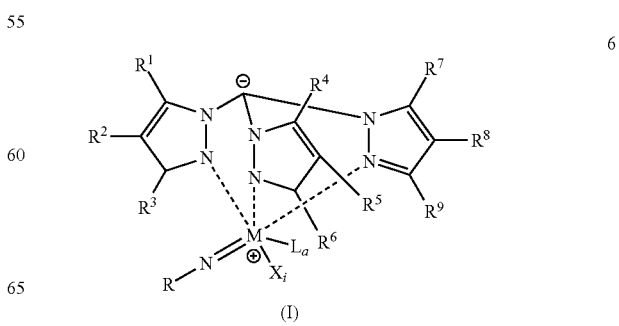

(I)

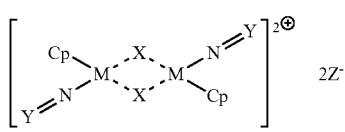

wherein R—R⁹=$C_1$-$C_{20}$ alkyl
or aryl group, $L_a$=coord ligand,
& $X_1$=anionic ligand
wherein N=Y is anionic imine
ligand, X=hydride or hydrocarbyl On the synthesis side, many research articles regarding chemistry of cyclopentadienyl imido titanium have been published by the Philip Mountford group at University of Oxford: Dunn et al., J. Chem. Soc., Dalton Trans., (1997), 293-304; Stewart et al., J. Organometallic Chemistry 564 (1998) 209-214; Stewart et al., Organometallics 17 (1998) 3271-3281; Guiducci et al., Organometallics 25, (2006), 1167-1187. Some of the molecules described are shown below.

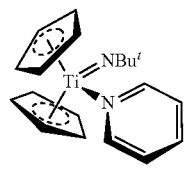

8

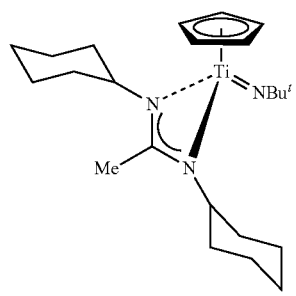

9

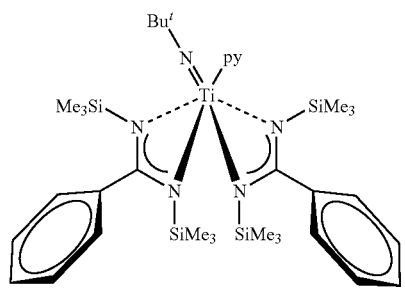

10

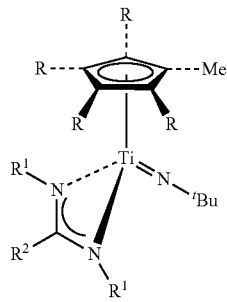

11

Among the developed molecules, some were liquids, but their thermal stability was not indicated. Applicants believe that such molecules were never considered for semi-conductor applications.

Some research articles about CVD/ALD using imido type metal precursors, some shown below, have been published by the C. J. Carmalt group at University College London: C. J. Carmalt et al., "Synthesis of TiN thin films from titanium imido complexes", Journal of Materials Chemistry 13, 2003, 84-87; C. J. Carmalt et al., "Titanium imido complexes as precursors to titanium nitride", J. Chem. Soc., Dalton Trans., 2002, 4055-4059; Potts et al., "Tungsten Imido Complexes as Precursors to Tungsten Carbonitride thin films", Dalton Transactions 2008, 5730-5736.

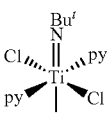

12

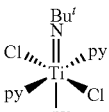

13

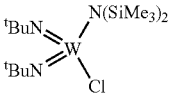

14

The widespread use of $TiCl_4$ results in the introduction of chlorinated by-products in the deposition line. These chlorinated by-products are undesirable due to their corrosiveness and toxicity. Other molecules currently in use, such as TDMAT and TDEAT, exhibit poor thermal stability, making it impossible to use them for high-temperature (up to 400° C.) depositions, particularly in ALD model.

The need remains for the development of halogen-free molecules that enable deposition of films with controlled thickness and composition at high temperatures.

SUMMARY

Disclosed are methods for depositing a group IV metal-containing film onto one or more substrates in a reactor. A metal-containing precursor having the following general formula is provided:

$$M(NR)X1_mX2_n \qquad (I)$$

wherein:
M is titanium, hafnium, or zirconium;
R is selected from H; a $C_1$-$C_4$ linear, branched, or cyclic alkyl or perfluoroalkyl group; or a $C_1$-$C_4$ linear, branched, or cyclic alkylsilyl or perfluoroalkylsilyl group;
X1 is selected from the group consisting of cyclopentadienyl, pentadienyl, cyclohexadienyl, hexadienyl, cycloheptadienyl, heptadienyl, cyclooctadienyl, and octadienyl, which may be substituted by a $C_1$-$C_4$ linear, branched, or cyclic alkyl group; $C_1$-$C_4$ linear, branched, or cyclic alkylsilyl group; $C_1$-$C_4$ alkylamino group; a $C_1$-$C_4$ linear, branched, or cyclic fluoroalkyl group; or combinations thereof;

X2 is independently selected from the group consisting of hydrogen; oxygen; a linear, branched, or cyclic $C_1$-$C_8$ alkyl; linear, branched, or cyclic $C_1$-$C_8$ alkoxy; linear, branched, or cyclic $C_1$-$C_8$ alkylamino group; linear, branched, or cyclic $C_1$-$C_8$ perfluoroalkyl; $C_1$-$C_4$ linear, branched, or cyclic alkylsilyl; linear, branched, or cyclic $C_1$-$C_8$ perfluoroalkoxy; $C_1$-$C_8$ alkene; formamidinate; amidinate; guamidinate; carbonyl; nitrile; isocyanate; ethylene; halogen; alkyldienes; cycloalkyldienes; norbornadiene; diazabutadiene; ethylenediamine; ethanolamine; β-diketonate; β-diketiminate; and β-enaminoketonate, which may be substituted by $C_1$-$C_4$ linear, branched, or cyclic alkyl group; $C_1$-$C_4$ alkylamino group; a $C_1$-$C_4$ linear, branched, or cyclic fluoroalkyl group; or combinations thereof;

m=0 or 1;
n=1 or 2; and
m+n=2

The metal-containing precursor is vaporized to form a vaporized precursor. The vaporized precursor is introduced into the reactor. At least part of the vaporized precursor is deposited onto the substrate to form a group IV metal-containing film. The disclosed methods may include one or more of the following aspects:

X1=Cp;
X2 being independently selected from the group consisting of linear, branched, or cyclic $C_1$-$C_8$ alkylamino group; formamidinate; amidinate; alkyldienes; cycloalkyldienes; norbornadiene; diazabutadiene; ethylenediamine; ethanolamine; β-diketonate; β-diketiminate; and β-enaminoketonate;
X2 being formamidinate, amidinate, or β-diketiminate;
m=1 and n=1;
the metal-containing precursor being selected from the group consisting of:
  TiCp(NtBu)(NMe$_2$), TiCp(NtBu)(NEt$_2$), TiCp(NtBu)(N(EtMe)$_2$),
  TiCp(NtBu)(N(SiMe$_3$)$_2$), TiCp(NtBu)[MeC(NSiMe$_3$)$_2$], TiCp(NtBu)[MeC(NiPr)$_2$],
  TiCp(NtBu)[MeC(NtBu)$_2$], TiCp(NtBu)[MeC(NtBuEt)$_2$],
  TiCp(NtBu)[HC(C(Me)N(Me))$_2$], TiCp(NtBu)[HC(C(Me)N(Et))$_2$],
  HfCp(NtBu)(NMe$_2$), HfCp(NtBu)(NEt$_2$), HfCp(NtBu)(N(EtMe)$_2$),
  HfCp(NtBu)(N(SiMe$_3$)$_2$), HfCp(NtBu)[MeC(NSiMe$_3$)$_2$],
  HfCp(NtBu)[MeC(NiPr)$_2$], HfCp(NtBu)[MeC(NtBu)$_2$],
  HfCp(NtBu)[MeC(NtBuEt)$_2$], HfCp(NtBu)[HC(C(Me)N(Me))$_2$],
  HfCp(NtBu)[HC(C(Me)N(Et))$_2$],
  ZrCp(NtBu)(NMe$_2$), ZrCp(NtBu)(NEt$_2$), ZrCp(NtBu)(N(EtMe)$_2$),
  ZrCp(NtBu)(N(SiMe$_3$)$_2$), ZrCp(NtBu)[MeC(NSiMe$_3$)$_2$], ZrCp(NtBu)[MeC(NiPr)$_2$],
  ZrCp(NtBu)[MeC(NtBu)$_2$], ZrCp(NtBu)[MeC(NtBuEt)$_2$],
  ZrCp(NtBu)[HC(C(Me)N(Me))$_2$], and ZrCp(NtBu)[HC(C(Me)N(Et))$_2$];
m=0 and n=2;
the metal-containing precursor being selected from the group consisting of
  Ti(NtBu)[HC(C(Me)N(Me))$_2$]$_2$, Ti(NtBu)[HC(C(Me)N(Et))$_2$]$_2$,
  Hf(NtBu)[HC(C(Me)N(Me))$_2$]$_2$, Hf(NtBu)[HC(C(Me)N(Et))$_2$]$_2$,
  Zr(NtBu)[HC(C(Me)N(Me))$_2$]$_2$, and Zr(NtBu)[HC(C(Me)N(Et))$_2$]$_2$;
the depositing step comprising a chemical vapor deposition (CVD) or an atomic layer deposition (ALD) process;
the group IV metal-containing film being selected from the group consisting of a group IV metal film, a group IV metal oxide film, and a group IV metal nitride film;
introducing precursors of other metallic elements into the reactor to tune the composition of the group IV metal-containing film;
the reactor having a temperature between about 50° C. and about 600° C., preferably between about 200° C. and about 500° C., and more preferably between about 300° C. and about 400° C.;
the reactor having a pressure between about 0.0001 Torr and about 1000 Torr, preferably between about 0.1 Torr and about 10 Torr;
introducing a reactant into the reactor and reacting the reactant with the vaporized precursor;
the reactant comprising a reducing agent;
the reactant being selected from the group consisting of $N_2$, $H_2$, $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzenfuran, pyrazoline, trimethylaluminium, dimethylzinc, diethylzinc, radical species thereof, and mixtures thereof;
the reactant comprising an oxidizing agent; and
the reactant being selected from the group consisting of $O_2$, $O_3$, $H_2O$, $H_2O_2$, NO, $NO_2$, carboxylic acids, formic acid, acetic acid, propionic acid, radical species thereof, and mixtures thereof.

Also disclosed are group IV metal-containing film-coated substrates comprising the products of the disclosed methods.

Notation and Nomenclature

Certain terms are used throughout the following description and claim to refer to particular system components.

The standard abbreviations of the elements from the periodic table of elements are used herein. It should be understood that elements may be referred to by these abbreviations (e.g., Ti refers to titanium, Hf refers to hafnium, Zr refers to zirconium, etc).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "Pr," refers to a propyl group; the abbreviation, "iPr," refers to an isopropyl group; the abbreviation "Bu" refers to butyl (n-butyl); the abbreviation "tBu" refers to tert-butyl; the abbreviation "sBu" refers to sec-butyl; the abbreviation "acac" refers to acetylacetonato/acetylacetonate; the abbreviation "tmhd" refers to 2,2,6,6-tetramethyl-3,5-heptadionato; the abbreviation "od" refers to 2,4-octadionato; the abbreviation "mhd" refers to 2-methyl-3,5-hexadinonato; the abbreviation "tmod" refers to 2,2,6,6-tetramethyl-3,5-octanedionato; the abbreviation "ibpm" refers to 2,2,6-trimethyl-3-5-heptadionato; the abbreviation "hfac" refers to hexafluoroacetylacetonato; the abbreviation "tfac" refers to trifluoroacetylacetonato; the abbreviation "Cp" refers to cyclopentadienyl; the abbreviation "Cp*" refers to pentamethylcyclopentadienyl; the abbreviation "cod" refers to cyclooctadiene; the abbreviation "dkti" and the structure $R^1C(C(R^2)N(R^3))_2$ refers to diketimine/diketiminate (with $R^1$ being the R ligand connected to the C at the apex of the dkti ligand in the structure below, each $R^2$ independently being the R ligand connected to the C in the dkti chain, and each $R^3$ independently being the R ligand connected to the N; for example $HC(C(Me)N(Me))_2$); the abbreviation "emk" refers to enaminoketones/enaminoketonates (whatever the R ligand bonded to the nitrogen atom); the abbreviation "amd" and the structure $R^1C(N(R^2))_2$ refers to amidinate (with $R^1$ being the R ligand connected to C in the structure below and each $R^2$ independently being the R ligand connected to each N; for example $MeC(N(SiMe_3)_2)$); the abbreviation "formd" refers to formamidinate; the abbreviation "dab" refers to diazabutadiene (whatever the R ligand on the nitrogen atom).

For a better understanding of the generic structures of some of the ligands discussed above, the structures are represented below, wherein each R is independently selected from H; a $C_1$-$C_6$ linear, branched, or cyclic alkyl or aryl group; an amino substituent such as $NR_1R_2$ or $NR_1R_2R_3$, shown below as bonded to the metal M, where $R_1$, $R_2$, and $R_3$ are independently selected from H, and a $C_1$-$C_6$ linear, branched, or cyclic alkyl or aryl group; and an alkoxy substituent such as $OR_4$, or $OR_4R_5$, shown below as bonded to the metal M, where W and $R^5$ are independently selected from H, and a $C_1$-$C_6$ linear, branched, or cyclic alkyl or aryl group.

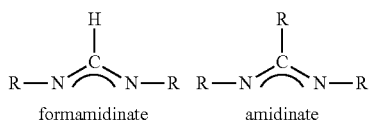
formamidinate    amidinate

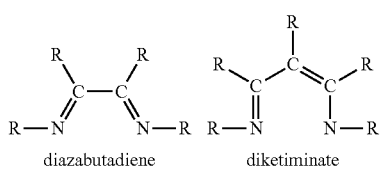
diazabutadiene    diketiminate

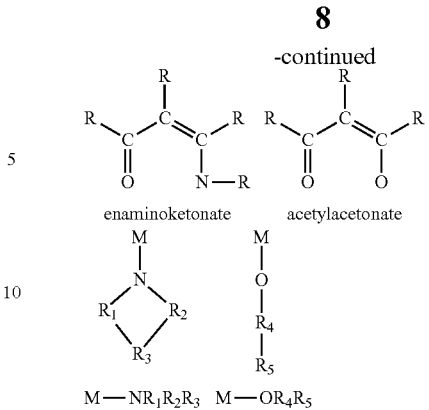
enaminoketonate    acetylacetonate $M$—$NR_1R_2R_3$    $M$—$OR_4R_5$

BRIEF DESCRIPTION OF THE FIGURES

For a further understanding of the nature and objects of the present invention, reference should be made to the following detailed description, taken in conjunction with the accompanying figure wherein:

FIG. 1 is a graph of the thermogravimetric analysis (TGA) showing percent mass loss versus temperature of TiCp(NtBu)[MeC(N(SiMe$_3$))$_2$];

FIG. 2 is a TGA graph showing percent mass loss versus temperature of TiCp(NtBu)[MeC(NiPr)$_2$];

FIG. 3 is a TGA graph showing percent mass loss versus temperature of TiCp(NtBu)[MeC(NtBu)$_2$];

FIG. 4 is a TGA graph showing percent mass loss versus temperature of TiCp(NtBu)[MeC(NtBu/Et)$_2$];

FIG. 5 is a TGA graph showing percent mass loss versus temperature of TiCp(NtBu)[HC(C(Me)N(Me))$_2$];

FIG. 6 is a TGA graph showing percent mass loss versus temperature of TiCp(NtBu)[HC(C(Me)N(Et))$_2$];

FIG. 7 is a TGA graph showing percent mass loss versus temperature of Ti(NtBu)[HC(C(Me)N(Me))$_2$]$_2$;

FIG. 8 is a TGA graph showing percent mass loss versus temperature of Ti(NtBu)[HC(C(Me)N(Et))$_2$]$_2$;

FIG. 9 is a graph of the differential scanning calorimetry results for TiCp(NtBu)[MeC(N(SiMe$_3$))$_2$] and tetrakis(ethylmethyl)amino titanium (TEMAT); and FIG. 10 is a graph of the thermal decomposition temperatures of some of the disclosed molecules compared to tetrakis (diethylamino) titanium (TDEAT) and TEMAT.

DESCRIPTION OF PREFERRED EMBODIMENTS

Disclosed herein are non-limiting embodiments of methods, apparatus, and compounds which may be used in the manufacture of semiconductor, photovoltaic, LCD-TFT, or flat panel type devices.

Disclosed are group IV metal-containing precursors that may be used for the deposition of group IV metal-containing films (nitride, oxide, and metal) at high process temperatures. The disclosed precursors have the following formula:

$$M(NR)X1_mX2_n \qquad (I)$$

wherein:
M is a group IV metal, such as titanium, hafnium, or zirconium;
R is selected from H; a $C_1$-$C_4$ linear, branched, or cyclic alkyl or perfluoroalkyl group (in which all or none of the substituents are F, i.e. totally fluorinated or non-fluorinated); or a $C_1$-$C_4$ linear, branched, or cyclic alkylsilyl (mono, bis, or trisalkyl) or perfluoroalkylsilyl group (in which all or none of the substituents are F, i.e. totally fluorinated or non-fluorinated);

X1 is selected from the group consisting of cyclopentadienyl, pentadienyl, cyclohexadienyl, hexadienyl, cycloheptadienyl, heptadienyl, cyclooctadienyl, and octadienyl, which may be substituted by a $C_1$-$C_4$ linear, branched, or cyclic alkyl group; $C_1$-$C_4$ linear, branched, or cyclic alkylsilyl group (mono, bis, or trisalkyl); $C_1$-$C_4$ alkylamino group; a $C_1$-$C_4$ linear, branched, or cyclic fluoroalkyl group (in which all or none of the substituents are F, i.e. totally fluorinated or non-fluorinated); or combinations thereof;

X2 is independently selected from the group consisting of hydrogen; oxygen; a linear, branched, or cyclic $C_1$-$C_8$ alkyl; linear, branched, or cyclic $C_1$-$C_8$ alkoxy; linear, branched, or cyclic $C_1$-$C_8$ alkylamino group; linear, branched, or cyclic $C_1$-$C_8$ perfluoroalkyl (in which all or none of the substituents are F, i.e. totally fluorinated or non-fluorinated); $C_1$-$C_4$ linear, branched, or cyclic alkylsilyl (mono, bis, or trisalkyl); linear, branched, or cyclic $C_1$-$C_8$ perfluoroalkoxy (in which all or none of the substituents are F, i.e. totally fluorinated or non-fluorinated); $C_1$-$C_8$ alkene; formamidinate; amidinate; guamidinate; carbonyl; nitrile; isocyanate; ethylene; halogen such as F, Cl, Br, or I; alkyldienes such as butadiene, pentadiene, hexadiene, heptadiene, octadiene, etc; cycloalkyldienes such as cyclobutadiene, cyclopentadiene, cyclohexadiene, cycloheptadiene, cyclooctadiene, etc.; norbornadiene; diazabutadiene; ethylenediamine; ethanolamine; β-diketonate; β-diketiminate; and β-enaminoketonate, which may be substituted by $C_1$-$C_4$ linear, branched, or cyclic alkyl group; $C_1$-$C_4$ alkylamino group; a $C_1$-$C_4$ linear, branched, or cyclic fluoroalkyl group (in which all or none of the substituents are F, i.e. totally fluorinated or non-fluorinated); or combinations thereof;

m=0 or 1;

n=1 or 2; and m+n=2.

The disclosed group IV metal-containing precursors are thermally stable and may be halogen free. The use of cyclopentadienyl and imido ligands linked to the metal center secures thermal stability, allowing a large deposition temperature window, and low impurity contamination. The disclosed precursors may be prepared as described in the literature. See, e.g., the articles published by the Philip Mountford group at University of Oxford cited in the Background above. Exemplary methods of preparing the disclosed precursors are also included in the Examples that follow.

Preferably, when m=1 and n=1, X1=Cp and X2 is selected from the group consisting of linear, branched, or cyclic $C_1$-$C_3$ alkylamino group; formamidinate; amidinate; alkyldienes; cycloalkyldienes; norbornadiene; diazabutadiene; ethylenediamine; ethanolamine; β-diketonate; β-diketiminate; and β-enaminoketonate. Even more preferably, X2 is formamidinate, amidinate, or β-diketiminate. Exemplary compounds of this formula include but are not limited to:

TiCp(NtBu)(NMe$_2$), TiCp(NtBu)(NEt$_2$), TiCp(NtBu)(N(EtMe)$_2$),
TiCp(NtBu)(N(SiMe$_3$)$_2$), TiCp(NtBu)[MeC(NSiMe$_3$)$_2$], TiCp(NtBu)[MeC(NiPr)$_2$],
TiCp(NtBu)[MeC(NtBu)$_2$], TiCp(NtBu)[MeC(NtBuEt)$_2$], TiCp(NtBu)[HC(C(Me)N(Me))$_2$], TiCp(NtBu)[HC(C(Me)N(Et))$_2$],
HfCp(NtBu)(NMe$_2$), HfCp(NtBu)(NEt$_2$), HfCp(NtBu)(N(EtMe)$_2$),
HfCp(NtBu)(N(SiMe$_3$)$_2$), HfCp(NtBu)[MeC(NSiMe$_3$)$_2$], HfCp(NtBu)[MeC(NiPr)$_2$], HfCp(NtBu)[MeC(NtBu)$_2$], HfCp(NtBu)[MeC(NtBuEt)$_2$], HfCp(NtBu)[HC(C(Me)N(Me))$_2$], HfCp(NtBu)[HC(C(Me)N(Et))$_2$],
ZrCp(NtBu)(NMe$_2$), ZrCp(NtBu)(NEt$_2$), ZrCp(NtBu)(N(EtMe)$_2$),
ZrCp(NtBu)(N(SiMe$_3$)$_2$), ZrCp(NtBu)[MeC(NSiMe$_3$)$_2$], ZrCp(NtBu)[MeC(NiPr)$_2$],
ZrCp(NtBu)[MeC(NtBu)$_2$], ZrCp(NtBu)[MeC(NtBuEt)$_2$],
ZrCp(NtBu)[HC(C(Me)N(Me))$_2$], and ZrCp(NtBu)[HC(C(Me)N(Et))$_2$].

Preferably, when m=0 and n=2, X2 is independently selected from the group consisting of linear, branched, or cyclic $C_1$-$C_8$ alkylamino group; formamidinate; amidinate; alkyldienes; cycloalkyldienes; norbornadiene; diazabutadiene; ethylenediamine; ethanolamine; β-diketonate; β-diketiminate; and β-enaminoketonate. Even more preferably, X2 is formamidinate, amidinate, or β-diketiminate. Exemplary compounds of this formula include but are not limited to Ti(NtBu)[HC(C(Me)N(Me))$_2$]$_2$, Ti(NtBu)[HC(C(Me)N(Et))$_2$]$_2$, Hf(NtBu)[HC(C(Me)N(Me))$_2$]$_2$, Hf(NtBu)[HC(C(Me)N(Et))$_2$]$_2$, Zr(NtBu)[HC(C(Me)N(Me))$_2$]$_2$, and Zr(NtBu)[HC(C(Me)N(Et))$_2$]$_2$.

The disclosed precursors may be used to deposit a thin film using any deposition methods known to those of skill in the art. Examples of suitable deposition methods include without limitation, conventional chemical vapor deposition (CVD), low pressure chemical vapor deposition (LPCVD), plasma enhanced chemical vapor depositions (PECVD), atomic layer deposition (ALD), pulsed chemical vapor deposition (PCVD), plasma enhanced atomic layer deposition (PEALD), or combinations thereof.

The disclosed precursors may be supplied either in neat form or in a blend with a suitable solvent, such as ethyl benzene, xylene, mesitylene, decane, dodecane. The disclosed precursors may be present in varying concentrations in the solvent.

The neat or blended precursor is introduced into a reactor in vapor form by conventional means, such as tubing and/or flow meters. The precursor in vapor form may be produced by vaporizing the neat or blended precursor solution through a conventional vaporization step such as direct vaporization, distillation, or by bubbling. The neat or blended precursor may be fed in liquid state to a vaporizer where it is vaporized before it is introduced into the reactor. Alternatively, the neat or blended precursor may be vaporized by passing a carrier gas into a container containing the precursor or by bubbling the carrier gas into the precursor. The carrier gas may include, but is not limited to, Ar, He, $N_2$, and mixtures thereof. Bubbling with a carrier gas may also remove any dissolved oxygen present in the neat or blended precursor solution. The carrier gas and precursor are then introduced into the reactor as a vapor.

If necessary, the container of disclosed precursor may be heated to a temperature that permits the precursor to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of precursor vaporized.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates onto which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium, or gold) may be used. The substrate may also have one or more layers of differing materials already deposited upon it from a previous manufacturing step.

The temperature and the pressure within the reactor are held at conditions suitable for ALD or CVD depositions. In other words, after introduction of the vaporized precursor into the chamber, conditions within the chamber are such that at least part of the vaporized precursor is deposited onto the substrate to form a metal-containing film. For instance, the pressure in the reactor may be held between about 0.0001 torr and about 1000 torr, or preferably between about 0.1 torr and 10 torr, as required per the deposition parameters. Likewise, the temperature in the reactor may be held between about 50° C. and about 600° C., preferably between about 200° C. and about 500° C., and more preferably 300° C. to 400° C.

In addition to the disclosed precursor, a reactant may also be introduced into the reactor. The reactant may be an oxidizing gas such as one of $O_2$, $O_3$, $H_2O$, $H_2O_2$, NO, $NO_2$, carboxylic acids, formic acid, acetic acid, propionic acid, and mixtures thereof. Alternatively, the reactant may be a reducing gas such as one of $H_2$, $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzenfuran, pyrazoline, trimethylaluminium, dimethylzinc, diethylzinc, radical species thereof, and mixtures thereof.

The reactant may be treated by a plasma, in order to decompose the reactant into its radical form. $N_2$ may also be utilized as a reducing gas when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reaction chamber, for instance, in a remotely located plasma system. One of skill in the art will recognize methods and apparatus suitable for such plasma treatment.

The vapor deposition conditions within the chamber allow the disclosed precursor and the reactant to react and form a group IV metal-containing film on the substrate. In some embodiments, Applicants believe that plasma-treating the reactant may provide the reactant with the energy needed to react with the disclosed precursor.

Depending on what type of film is desired to be deposited, a second precursor may be introduced into the reactor. The second precursor comprises another metal source, such as copper, praseodymium, manganese, ruthenium, titanium, tantalum, bismuth, zirconium, hafnium, lead, niobium, magnesium, aluminum, lanthanum, or mixtures of these. When a second metal containing precursor is utilized, the resultant film deposited on the substrate may contain at least two different metal types.

The disclosed precursor and any optional reactants or precursors may be introduced sequentially (as in ALD) or simultaneously (as in CVD) into the reaction chamber. The reaction chamber may be purged with an inert gas between the introduction of the precursor and the introduction of the reactant. Alternatively, the reactant and the precursor may be mixed together to form a reactant/precursor mixture, and then introduced to the reactor in mixture form.

The vaporized precursor and the reactant may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed precursor and a reactant are simultaneously introduced into the reactor. The two react to form the resulting thin film. When the reactant in this exemplary CVD process is treated with a plasma, the exemplary CVD process becomes an exemplary PECVD process. The co-reactant may be treated with plasma prior or subsequent to introduction into the chamber.

In one non-limiting exemplary ALD type process, the vapor phase of the disclosed precursor is introduced into the reactor, where it is contacted with a suitable substrate. Excess precursor may then be removed from the reactor by purging and/or evacuating the reactor. A reducing gas (for example, $H_2$) is introduced into the reactor where it reacts with the absorbed precursor in a self-limiting manner. Any excess reducing gas is removed from the reactor by purging and/or evacuating the reactor. If the desired film is a metal film, this two-step process may provide the desired film thickness or may be repeated until a film having the necessary thickness has been obtained.

Alternatively, if the desired film is a bimetal film, the two-step process above may be followed by introduction of the vapor of a second metal-containing precursor into the reactor. The second metal-containing precursor will be selected based on the nature of the bimetal film being deposited. After introduction into the reactor, the second metal-containing precursor is contacted with the substrate. Any excess second metal-containing precursor is removed from the reactor by purging and/or evacuating the reactor. Once again, a reducing gas may be introduced into the reactor to react with the second metal-containing precursor. Excess reducing gas is removed from the reactor by purging and/or evacuating the reactor. If a desired film thickness has been achieved, the process may be terminated. However, if a thicker film is desired, the entire four-step process may be repeated. By alternating the provision of the metal-containing precursor, second metal-containing precursor, and reactant, a film of desired composition and thickness can be deposited.

When the reactant in this exemplary ALD process is treated with a plasma, the exemplary ALD process becomes an exemplary PEALD process. The co-reactant may be treated with plasma prior or subsequent to introduction into the chamber.

The group IV metal-containing films or metal-containing layers resulting from the processes discussed above may include a pure metal (M), metal silicate ($M_kSi_l$), metal oxide ($M_nO_m$) or metal oxynitride ($M_xN_yO_z$) film wherein M=Ti, Zr, or Hf and k, l, m, n, x, y, and z are integers which inclusively range from 1 to 6. One of ordinary skill in the art will recognize that by judicial selection of the appropriate disclosed precursor, optional second metal-containing precursors, and co-reactant species, the desired film composition may be obtained.

EXAMPLES

The following non-limiting examples are provided to further illustrate embodiments of the invention. However, the examples are not intended to be all inclusive and are not intended to limit the scope of the inventions described herein.

Example 1

Synthesis of M(NR)X1X2, wherein M=Ti, NR=tert-butylimido, X1=Cp and X2=amd

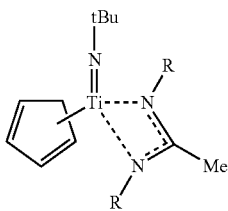

Compound 1: Cyclopentadienyl(tert-butylimido)dialkylamidinato Titanium {TiCp(NtBu)[MeC(NR)$_2$]} in which R=trimethylsilyl (SiMe$_3$) was obtained from three steps of reaction from TiCl$_4$.

Step 1: tBuNH$_2$ (60 mL, 6.3 eq) was added dropwise over 15 min to a solution of TiCl$_4$ (10 mL, 0.091 mol) in dichloromethane (150 mL) and stirred at −50° C. for 30 min. The resulting orange solution was allowed to warm to room temperature and then stirring was continued for 5 h. The reaction mixture was filtered to yield an orange solution to which pyridine (17 mL, 2.3 eq) was added. After 4 h the volatile components were removed from the mixture and the residual solid was extracted into 150 mL of a 10:1 toluene: dichloromethane mixture. The resulting deep orange solution was again filtered and evaporated under reduced pressure. The extraction was repeated two times followed by washing with pentane (50 mL). The solution was evaporated and after drying in vacuum provided 22.0 g of Ti(NtBu)Cl$_2$Py$_2$ as an orange solid. Yield: 70%. NMR (CDCl$_3$): $^1$H (400 MHz), 9.20 (4H, d, o-H of NC$_5$H$_5$), 7.78 (2H, t, p-H of NC$_5$H$_5$), 7.34 (4H, t, m-H of NC$_5$H$_5$) and 0.85 (9H, s, NtBu)

Step2: To a solution of the orange solid of step 1 Ti(NtBu)Cl$_2$Py$_2$ (3 g, 8.7 mmol) in THF (40 mL) was added a solution of LiCp (0.67 g, 8.7 mmol) in THF (40 mL) via cannula at room temperature. The solution was darkened, and stirring was continued for 5 h. The volatiles were then removed under reduced pressure and the residue extracted into Et$_2$O aned pentane (each 30 mL). The solution was filtered and evaporated under reduced pressure providing 2.0 g of Ti(NtBu) CpClPy as a bright red solid. Yield: 80%. NMR (CDCl$_3$): 1H (400 MHz), 8.73 (2H, d, o-H of NC$_5$H$_5$), 7.82 (1H, p-H of NC$_5$H$_5$), 7.34 (2H, t, m-H of NC$_5$H$_5$), 6.34 (5H, s, C$_5$H$_5$), and 1.07 (9H, s, NtBu)

Step3: To a solution of the red solid of step 2 Ti(NtBu) CpClPy (1.5 g, 5.0 mmol) in THF (30 mL) was added a Li[MeC(N(SiMe$_3$))$_2$] (1.04 g, 5.0 mmol) in THF (30 mL) solution at −78° C. The resulting mixture immediately darkened. The reaction mixture was allowed to warm to room temperature and stirring was continued for 12 h. The volatiles were then removed under reduced pressure and the residue extracted into pentane (30 mL) and filtered to give a deep red sticky solid. It was distilled providing 0.5 g of TiCp(NtBu) [MeC(N(SiMe$_3$))$_2$] as a purple liquid. Yield: 30%. NMR (C$_6$D$_6$): 1H (400 MHz), 6.63 (5H, s, C$_5$H$_5$), 1.87 (3H, s, CH$_3$), 1.11 (9H, s, NtBu), and 0.14 (9H, s, SiMe$_3$).

Different types of amidinates, e.g., Compound 2 in which R=iPr, Compound 3 in which R=tBu, Compound 4 in which R=tBu/Et, were synthesized using the same procedure described above. All the molecules were obtained as purple liquid, except Compound 3, which was a purple solid.

Example 2

Synthesis of M(NR)X1X2, wherein M=Ti, NR=tert-butylimido, X1=Cp and X2=dkti

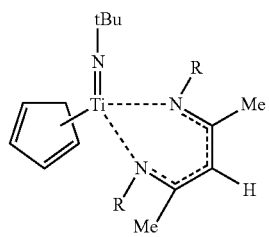

Compound 5: Cyclopentadienyl(tert-butylimido)(β-diketiminato) Titanium {TiCp(NtBu)[HC(C(Me)N(R))$_2$]}, in which R=Me, was obtained from three steps of reaction from TiCl$_4$ using the same procedure as Example 1, except that step 3 was replaced by the following:

Step3: To a solution of the product of Step 2 Ti(NtBu) CpClPy (1.5 g, 5.0 mmol) in THF (30 mL) was added a Li[HC(C(Me)N(Me))$_2$] (0.66 g, 5.0 mmol) in THF (30 mL) solution at −78° C. The mixture immediately darkened. The reaction mixture was allowed to warm to room temperature and stirring was continued for 12 h. The volatiles were then removed under reduced pressure and the residue extracted into pentane (30 mL) and filtered to give a deep red sticky solid. It was sublimed under reduced pressure providing 0.5 g of a red powder. Yield: 30%. NMR (C$_6$D$_6$): 1H (400 MHz), 6.03 (5H, s, C$_5$H$_5$), 4.82 (1H, s, CH), 3.06 (6H, s, CCH$_3$), 1.57 (6H, s, NCH$_3$) and 1.30 (9H, s, NtBu).

A second compound having the diketiminate structure, Compound 6 in which R=Et, was synthesized using the same procedure described above, also providing a red powder.

Example 3

Synthesis of M(NR)X2$_2$, wherein M=Ti, NR=tert-butylimido, and X2=dkti

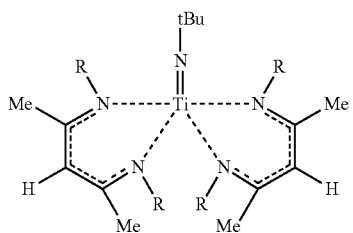

Compound 7: (tert-butylimido)bis(β-diketiminato)Titanium {Ti(NtBu)[HC(C(Me)N(R))$_2$]$_2$}, in which R=Me, was obtained from two steps of reaction from TiCl$_4$.

Step 1: same as described in example 1

Step 2: To a solution of the product of Step 1 Ti(NtBu)Cl$_2$Py$_2$ (3 g, 8.7 mmol) in THF (40 mL) was added a Li[HC(C(Me)N(Me))$_2$]$_2$ (1.32 g, 17.4 mmol) in THF (30 mL) solution at −78° C. The mixture immediately darkened. Stirring was continued for 10 h. The volatiles were removed under reduced pressure and the residue extracted into Et$_2$O (30 mL) and filtered to give a sticky solid. It was sublimed under reduced pressure providing 2.5 g of a greenish blue solid. Yield: 80%. NMR (CDCl$_3$): 1H (400 MHz), 4.33 (2H, s, H of H—C in diketimine), 3.40 (12H, H of CCH$_3$), 1.64 (12H, s, NCH$_3$), and 1.54 (9H, s, NtBu)

A second compound having the bis-diketiminate structure, Compound 8 in which R=Et, was synthesized using the same procedure described above, producing a bright yellow powder.

Example 4

Thermal Characterization of Compounds 1-4 [cyclopentadienyl(tert-butylimido)(dialkylamidinato) Titanium {TiCp(NtBu)[MeC(NR)$_2$]}]

To measure the thermal stability and volatility of TiCp(NtBu)[MeC(NR)$_2$], thermogravimetry analysis (TGA) was performed in a glove box under inert atmosphere at a heating rate of 10° C./min. FIG. 1-4 show the result of TGA in an open aluminum pan of Compounds 1-4, respectively.

It was observed that Compounds 1 and 2 evaporate very smoothly without leaving residues, while Compounds 3 and 4 exhibits a few percent of residual amounts. The end of evaporation of the four compounds is roughly the same at 250° C., which seems to prove that the volatility of Compounds 1 and 2 seems higher than that of Compounds 3 and 4. The absence of residual products also proves that, under these conditions, Compounds 1 and 2 are stable at least up to 250° C. Other measurements were performed to determine the temperature of decomposition as well as the volatility of all the compounds more accurately (see Example 7).

Example 5

Thermal Characterization of Compounds 5 & 6 [(tert-butylimido-cyclopentadienyl-β-diketiminato) Titanium {TiCp(NtBu)[HC(C(Me)N(R))$_2$]}]

FIGS. 5 and 6 show the TGA results of Compounds 5 and 6, respectively, which were measured by same method as in Example 4.

It was observed that Compounds 5 and 6 evaporate very smoothly without leaving residues. The end of evaporation of the two compounds is roughly the same at 290° C., which seems to prove that their volatility is roughly the same. It can also be concluded that under these conditions the two compounds are stable up to 290° C., as no decomposition is observed. This temperature is much higher than the temperature observed for the current standard molecules (e.g. TDMAT, TDEAT and TEMAT) for which, under the same conditions, decomposition was already observed from 260° C. The high thermal stability was confirmed with other measurements (see Example 7).

Example 6

Thermal Characterization of Compounds 7 & 8 [(tert-butylimido-bis-β-diketiminato) Titanium {Ti(NtBu)[HC(C(Me)N(R))$_2$]$_2$}]

FIGS. 7 and 8 show the TGA results of Compounds 7 and 8, respectively, which were measured by the same method as in Example 4.

It was observed that Compound 8 evaporates very smoothly without leaving residues, whereas a few percent residue was detected for Compound 7. The end of evaporation of the two compounds is roughly the same at 300° C., which seems to prove that their volatility is roughly the same. It can also be concluded that under these conditions Compound 8 is stable up to 300° C., as no decomposition is observed. The stability of Compound 7 up to that temperature is not sure in view of these results. 300° C. is much higher than the temperature observed for the current standard molecules (e.g. TDMAT, TDEAT and TEMAT) for which, under the same conditions, decomposition was already observed from 260° C. The high thermal stability was confirmed with other measurements (see Example 7).

Example 7

Thermal Characterization of Compounds 1-8

A more constraining test was performed with the same tool, using a closed pan TGA configuration that limits evaporation of the precursor, and thus delays the mass loss. As a consequence, the behavior of the molecules in a higher temperature range could be examined. Table 1 summarizes the properties of Compounds 1-8 including thermal decomposition temperature (T$_D$) measured by closed pan TGA and vapor pressure (VP).

TABLE 1

Properties of Compounds 1 - 8

| Compounds | (1) | (2) | (3) | (4) | (5) | (6) | (7) | (8) |
|---|---|---|---|---|---|---|---|---|
| Phase[1] | L | L | L | S | S | S | S | S |
| T$_D$ (° C.)[2] | 295 | 260 | 233 | 238 | 330 | 340 | 280 | 320 |
| VP (° C.)[3] | 105 | 115 | 120 | 130 | 137 | 140 | 166 | 163 |

[1]Phase: L = liquid, S = solid (MP < 80° C. mostly)
[2]T$_D$ = decomposition temperature (evaluated by TGA)
[3]VP (° C.) = temperature which exhibits VP = 1 Torr To confirm the thermal stability measured by TGA, differential scanning calorimetry (DSC) was also performed using gold coated high pressure pans under a heating rate of 10° C./min.

FIG. 9 shows the DSC result for Compound 1 and tetrakis(ethylmethyl)amino titanium (TEMAT), which is one of common molecules developed for the application of titanium-containing film deposition. From this result, it could be confirmed the same decomposition temperature as observed from TGA. It was observed that the decomposition temperature of Compound 1 is around 30° C. higher than that of TEMAT. Having a higher temperature of decomposition would be beneficial for obtaining films in ALD mode at higher temperature, leading to higher quality films.

FIG. 10 demonstrates the higher thermal decomposition temperatures of some of the disclosed molecules compared to two standard titanium molecules such as tetrakis(diethylamino) titanium (TDEAT) and TEMAT, and it further shows the results up to 80° C. higher than TEMAT. As stated previously, a higher decomposition temperature would be beneficial for obtaining films in ALD mode at higher temperature, leading to higher quality films.

Example 8

Prophetic TiN deposition using tetrakis(diethylamino)titanium (TDEAT)

Tetrakis(diethylamino)titanium (TDEAT) will be used to deposit TiN films in ALD mode. 100 g of TDEAT will be stored in a canister, heated at 80° C., and its vapors provided to the reaction furnace by a bubbling method. The delivery set-up enables alternate introductions of the titanium molecule and of ammonia. A clear window of constant growth rate is not expected to be obtained, even at temperatures as low as 200° C., which will prove that this molecule cannot be used in ALD mode.

Example 9

Prophetic Results of TiN Depositions Using TiCp(NtBu)[MeC(N(SiMe$_3$))$_2$]

The molecule synthesized in Example 1, TiCp(NtBu)[MeC(N(SiMe$_3$))$_2$], will be used for ALD depositions. 40 g of the titanium molecule will be stored in a canister, heated at 100° C., and its vapors provided to the reaction furnace by a bubbling method. The delivery set-up enables alternate introductions of the titanium molecule and of ammonia. Titanium nitride films are expected to be obtained at a deposition rate of 1 Å/cycle, and expected to exhibit a constant deposition rate up to 410° C. Above this temperature, the deposition rate may increase drastically, showing the saturation mode characteristic of the ALD regime up to 410° C.

The composition of the films will be analyzed by different techniques (Auger, SIMS) and the films are expected to be mainly stoichiometric TiN, with a few percent of carbon impurities. The ALD upper temperature window is expected to be much higher than with TDEAT, which will confirm the higher thermal stability of the molecule (already mentioned in Example 7).

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for depositing a group IV metal-containing film onto one or more substrates, comprising:
    a) providing a reactor and at least one substrate disposed in the reactor;
    b) providing a metal-containing precursor having the general formula:

$$M(NR)X1_mX2_n \qquad (I)$$

wherein:
        M is titanium, hafnium, or zirconium;
        R is selected from H; a $C_1$-$C_4$ linear, branched, or cyclic alkyl or perfluoroalkyl group; or a $C_1$-$C_4$ linear, branched, or cyclic alkylsilyl or perfluoroalkylsilyl group;
        X1 is selected from the group consisting of cyclopentadienyl, pentadienyl, cyclohexadienyl, hexadienyl, cycloheptadienyl, heptadienyl, cyclooctadienyl, and octadienyl,
        which may be substituted by a $C_1$-$C_4$ linear, branched, or cyclic alkyl group; $C_1$-$C_4$ linear, branched, or cyclic alkylsilyl group; $C_1$-$C_4$ alkylamino group; a $C_1$-$C_4$ linear, branched, or cyclic fluoroalkyl group; or combinations thereof;
        X2 is independently selected from the group consisting of hydrogen; oxygen; a linear, branched, or cyclic $C_1$-$C_8$ alkyl; linear, branched, or cyclic $C_1$-$C_8$ alkoxy; linear, branched, or cyclic $C_1$-$C_8$ alkylamino; linear, branched, or cyclic $C_1$-$C_8$ perfluoroalkyl; $C_1$-$C_4$ linear, branched, or cyclic alkylsilyl; linear, branched, or cyclic $C_1$-$C_8$ perfluoroalkoxy; $C_1$-$C_8$ alkene; formamidinate; amidinate; guamidinate; carbonyl; nitrile; isocyanate; ethylene; halogen; alkyldienes; cycloalkyldienes; norbornadiene; diazabutadiene; ethylenediamine; ethanolamine; β-diketonate; β-diketiminate; and β-enaminoketonate,
        which may be substituted by $C_1$-$C_4$ linear, branched, or cyclic alkyl group; $C_1$-$C_4$ alkylamino group; a $C_1$-$C_4$ linear, branched, or cyclic fluoroalkyl group; or combinations thereof;
        m=1; and
        n=1;
    c) vaporizing the metal-containing precursor to form a vaporized precursor;
    d) introducing the vaporized precursor into the reactor; and
    e) depositing at least part of the vaporized precursor onto the substrate to form a group IV metal-containing film.

2. The method of claim 1, wherein X1=Cp, and X2 is selected from the group consisting of linear, branched, or cyclic $C_1$-$C_8$ alkylamino group; formamidinate; amidinate; alkyldienes; cycloalkyldienes; norbornadiene; diazabutadiene; ethylenediamine; ethanolamine; β-diketonate; β-diketiminate; and β-enaminoketonate.

3. The method of claim 2, wherein the metal-containing precursor is selected from the group consisting of:
    TiCp(NtBu)(NMe$_2$), TiCp(NtBu)(NEt$_2$), TiCp(NtBu)(N(EtMe)$_2$),
    TiCp(NtBu)(N(SiMe$_3$)$_2$), TiCp(NtBu)[MeC(NSiMe$_3$)$_2$], TiCp(NtBu)[MeC(NiPr)$_2$],
    TiCp(NtBu)[MeC(NtBu)$_2$], TiCp(NtBu)[MeC(NtBuEt)$_2$],
    TiCp(NtBu)[HC(C(Me)N(Me))$_2$], TiCp(NtBu)[HC(C(Me)N(Et))$_2$],
    HfCp(NtBu)(NMe$_2$), HfCp(NtBu)(NEt$_2$), HfCp(NtBu)(N(EtMe)$_2$),
    HfCp(NtBu)(N(SiMe$_3$)$_2$), HfCp(NtBu)[MeC(NSiMe$_3$)$_2$], HfCp(NtBu)[MeC(NiPr)$_2$], HfCp(NtBu)[MeC(NtBu)$_2$], HfCp(NtBu)[MeC(NtBuEt)$_2$],
HfCp(NtBu)[HC(C(Me)N(Me))$_2$], HfCp(NtBu)[HC(C(Me)N(Et))$_2$],
ZrCp(NtBu)(NMe$_2$), ZrCp(NtBu)(NEt$_2$), ZrCp(NtBu)(N(EtMe)$_2$),
ZrCp(NtBu)(N(SiMe$_3$)$_2$), ZrCp(NtBu)[MeC(NSiMe$_3$)$_2$], ZrCp(NtBu)[MeC(NiPr)$_2$],
ZrCp(NtBu)[MeC(NtBu)$_2$], ZrCp(NtBu)[MeC(NtBuEt)$_2$],
ZrCp(NtBu)[HC(C(Me)N(Me))$_2$], and ZrCp(NtBu)[HC(C(Me)N(Et))$_2$].

4. The method of claim 1, wherein the depositing step (e) comprises a chemical vapor deposition (CVD) or an atomic layer deposition (ALD) process.

5. The method of claim 1, wherein the group IV metal-containing film is selected from the group consisting of a group IV metal film, a group IV metal oxide film, and a group IV metal nitride film.

6. The method of claim 1, further comprising introducing precursors of other metallic elements into the reactor to tune the composition of the group IV metal-containing film.

7. The method of claim 1, wherein the reactor has a temperature between about 50° C. and about 600° C., preferably between about 200° C. and about 500° C., and more preferably between about 300° C. and about 400° C.

8. The method of claim 1, wherein the reactor has a pressure between about 0.0001 Torr and about 1000 Torr, preferably between about 0.1 Torr and about 10 Torr.

9. The method of claim 1, further comprising:
a) introducing a reactant into the reactor; and
b) reacting the reactant with the vaporized precursor.

10. The method of claim 9, wherein the reactant comprises a reducing agent.

11. The method of claim 10, wherein the reactant is selected from the group consisting of N$_2$, H$_2$, NH$_3$, SiH$_4$, Si$_2$H$_6$, Si$_3$H$_8$, (CH$_3$)$_2$SiH$_2$, (C$_2$H$_5$)$_2$SiH$_2$, (CH$_3$)SiH$_3$, (C$_2$H$_5$)SiH$_3$, phenyl silane, N$_2$H$_4$, N(SiH$_3$)$_3$, N(CH$_3$)H$_2$, N(C$_2$H$_5$)H$_2$, N(CH$_3$)$_2$H, N(C$_2$H$_5$)$_2$H, N(CH$_3$)$_3$, N(C$_2$H$_5$)$_3$, (SiMe$_3$)$_2$NH, (CH$_3$)HNNH$_2$, (CH$_3$)$_2$NNH$_2$, phenyl hydrazine, N-containing molecules, B$_2$H$_6$, 9-borabicyclo[3,3,1]nonane, dihydrobenzenfuran, pyrazoline, trimethylaluminium, dimethylzinc, diethylzinc, radical species thereof, and mixtures thereof.

12. The method of claim 9, wherein the reactant comprises an oxidizing agent.

13. The method of claim 12, wherein the reactant is selected from the group consisting of O$_2$, O$_3$, H$_2$O, H$_2$O$_2$, NO, NO$_2$, carboxylic acids, formic acid, acetic acid, propionic acid, radical species thereof, and mixtures thereof.

14. A group IV metal-containing film-coated substrate comprising the product of the method of claim 1.

* * * * *